United States Patent
Sauer et al.

(10) Patent No.: US 10,055,363 B2
(45) Date of Patent: Aug. 21, 2018

(54) METHOD FOR CONFIGURING AN INTERFACE UNIT OF A COMPUTER SYSTEM

(71) Applicant: dSPACE digital signal processing and control engineering GmbH, Paderborn (DE)

(72) Inventors: Jochen Sauer, Brakel (DE); Robert Leinfellner, Paderborn (DE); Matthias Klemm, Paderborn (DE); Thorsten Brehm, Paderborn (DE); Robert Polnau, Paderborn (DE); Matthias Schmitz, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 119 days.

(21) Appl. No.: 15/151,746

(22) Filed: May 11, 2016

(65) Prior Publication Data
US 2016/0335101 A1 Nov. 17, 2016

(30) Foreign Application Priority Data

May 11, 2015 (DE) .......... 10 2015 107 296
May 11, 2015 (DE) .......... 10 2015 107 299
(Continued)

(51) Int. Cl.
*G06F 13/00* (2006.01)
*G06F 13/10* (2006.01)
(Continued)

(52) U.S. Cl.
CPC ........ *G06F 13/102* (2013.01); *G06F 9/44505* (2013.01); *G06F 13/126* (2013.01);
(Continued)

(58) Field of Classification Search
None
See application file for complete search history.

(56) References Cited

U.S. PATENT DOCUMENTS 5,968,160 A * 10/1999 Saito ................. G06F 9/30087
711/202
6,038,391 A * 3/2000 Kawaba ............. G06F 11/3419
703/21
(Continued)

FOREIGN PATENT DOCUMENTS

EP 0 617 369 B1 11/1999
EP 2 799 983 A1 11/2014

OTHER PUBLICATIONS

Extended European Search Report for European Application No. 15193577.2 dated Mar. 16, 2016 with English translation.
(Continued)

*Primary Examiner* — Henry Tsai
*Assistant Examiner* — Aurangzeb Hassan
(74) *Attorney, Agent, or Firm* — Muncy, Geissler, Olds & Lowe, P.C.

(57) ABSTRACT

A method for configuring an interface unit of a computer system with a first processor and a second processor stored in the interface unit. A data link is set up between the first processor and the second processor. A peripheral of the computer system is configured to store input data in an input data channel and to read output data from an output data channel, and the second processor is configured to read the input data from the input data channel and to store output data in the output data channel. A sequence of processor commands for the second processor is created such that a number of subsequences is created.

16 Claims, 3 Drawing Sheets

(30) Foreign Application Priority Data

Nov. 9, 2015 (DE) .................. 10 2015 119 201
Nov. 9, 2015 (DE) .................. 10 2015 119 202

(51) Int. Cl.

| | | |
|---|---|---|
| G06F 13/12 | (2006.01) | |
| G06F 13/20 | (2006.01) | |
| G06F 13/40 | (2006.01) | |
| G06F 9/445 | (2018.01) | |
| G06F 15/78 | (2006.01) | |
| G11C 8/18 | (2006.01) | |
| G06F 13/38 | (2006.01) | |
| G06F 9/4401 | (2018.01) | |

(52) U.S. Cl.
CPC .......... *G06F 13/20* (2013.01); *G06F 13/4022* (2013.01); *G06F 13/4068* (2013.01); *G06F 13/4072* (2013.01); *G06F 15/7885* (2013.01); *G11C 8/18* (2013.01); *G06F 9/4411* (2013.01); *G06F 13/385* (2013.01)

(56) References Cited

U.S. PATENT DOCUMENTS

| | | | |
|---|---|---|---|
| 6,138,123 A * | 10/2000 | Rathbun | ........... G06F 17/30958 |
| 6,189,052 B1 | 2/2001 | Nilsson et al. | |
| 7,562,111 B2 | 7/2009 | Wybenga et al. | |
| 2002/0013895 A1* | 1/2002 | Kelley | ................. G06Q 10/087 713/1 |
| 2014/0324408 A1 | 10/2014 | Merten et al. | |

OTHER PUBLICATIONS

Duelks et al., "A real-time test and simulation environment based on standard FPGA hardware," IEEE 2009 Testing: Academic and Industrial Conference—Practice and Techniques, pp. 197-204 (Sep. 4, 2009).

"Auf zu Schnelleren Zeiten," dSpace magazine, at: http://www.dspace.com/shared/data/pdf/2012/Masiazine/4245quicktimes.pdf, pp. 1-4 (Jun. 1, 2012) with English translation.

Mertens et al., "When Processor and FPGA Work Together," dSpace magazine, at: http://www.dpace.com/shared/data/pdf//In2011/503dSpaceEkautomobile2011-06lowrespdf.pdf, pp. 1-3 (May 1, 2011) with English translation.

Vector, "CANextender, The Programmable Input/Output Device for the CAN Bus," Manual, pp. 1-2.

Maxim Integrated, MAX11300/MAX11301 PIXI Configuration Software User Guide, Rev 0, pp. 1-59 (Jan. 2015).

Rabbit, "Dynamic C Integrated C Development System for Rabbit 4000, 5000 and 6000 Microprocessors User's Manual," pp. 1-355 (2014).

Rabbit, "Rabbit RIO User's Manual," pp. 1-90 (2008).

Rabbit, "RabbitCore RCM4100 C-Programmable Core Module User's Manual," pp. 1-112 (2009).

* cited by examiner

METHOD FOR CONFIGURING AN INTERFACE UNIT OF A COMPUTER SYSTEM

This nonprovisional application claims priority under 35 U.S.C. § 119(a) to German Patent Application No. 10 2015 107 296.3, which was filed in Germany on May 11, 2015, German Patent Application No. 10 2015 107 299.8, which was filed in Germany on May 11, 2015, German Patent Application No. 10 2015 119 201.2, which was filed in Germany on Nov. 9, 2015 and German Patent Application No. 10 2015 119 202.0, which was filed in Germany on Nov. 9, 2015, and all of which are herein incorporated by reference.

BACKGROUND OF THE INVENTION

Field of the Invention

The present invention relates to a method for configuring an interface unit of a computer system and a computer system.

Description of the Background Art

Many computer systems have interface units for data exchange between a main processor and peripheral devices. An interface unit of this kind can be designed, for example, as a plug-in I/O card. Many interface units are equipped with their own processors for preprocessing incoming and outgoing data, whereby some interface units make it possible to adapt the programming of the processor in the interface unit flexibly to the requirements of the program executed by the main processor.

For example, the company Digi International Inc. provides an interface unit, freely programmable by the user, under the product name RabbitCore RCM4100. Another known approach is to store a plurality of program functionalities for preprocessing incoming and outgoing data persistently in the interface unit. The publication U.S. Pat. No. 6,189,052 B2, for example, describes this type of approach.

If the computer system is provided to execute the program, being executed by the main processor, in hard real-time, then the processes running on the computer system, in particular, also the processes executed by the processor stored in the interface unit, must be completed with certainty within a predefined time period. For this reason, the processor in the interface unit should function efficiently; i.e., the largest possible portion of the processor commands performed by it should be linked expediently to the programmed preprocessing of incoming and outgoing data. Furthermore, the processor stored in the interface unit should operate as deterministically as possible, therefore have low jitter, so that it is possible to estimate the time needed for executing processes sufficiently well.

SUMMARY OF THE INVENTION

It is therefore an object of the invention to provide a method for configuring an interface unit of a computer system, which assures a rapid and low-jitter execution of the program code, stored in a processor or a plurality of processors of the interface unit, for preprocessing data exchanged between a main processor and a peripheral of the computer system.

In an exemplary embodiment, a method for configuring an interface unit of a computer system is provided, whereby the computer system has a first processor and a first data link between the first processor and the interface unit and a second processor is or is made to be stored in the interface unit. The interface unit has at least two data channels, whereby a first input data channel can be designed as a data channel for storing the input data and a first output data channel as a data channel for storing the output data. Furthermore, a peripheral environment of the computer system is configured such that the peripheral environment comprises a number of peripheral devices and the peripheral environment is designed to store input data in the first input data channel by means of a second data link or to read output data from the first output data channel. The interface unit can be designed to provide a data link for reading the input data stored in the first input data channel by the second processor and to provide a data link for storing output data in the first output data channel by the second processor. A computer program is stored in the computer system, and the first processor is programmed to execute the computer program and during the execution of the computer program to assign a value, which is defined by the input data stored in the first input data channel, to a variable of the computer program.

It is provided according to an embodiment of the invention that a sequence of processor commands is created and loaded in the second processor, after the loading of the sequence in the second processor, the execution of the computer program by the first processor and the execution of the sequence by the second processor are started, and during the execution of the sequence the value, defined by the data stored in the first input data channel, is written at a first memory address. The sequence of processor commands is created such that a number of subsequences of processor commands is created, whereby a first subsequence represents a routine for reading in and processing at least the data stored in the first input data channel and a second subsequence represents a routine for reading in and processing at least the data stored in a second input data channel or represents a routine for processing data generated by the first processor and for storing the processed data in the first output data channel, and the sequence is created by the merging of the subsequences.

A subsequence in an execution of the method of the invention can be understood to be a series of processor commands to be executed by the second processor, which in their entirety form a routine for routing input data, i.e., a routine for reading the input data from an input data channel and for storing the read input data at a memory address readable by the first processor, or which in their entirety form a routine for routing output data, i.e., a routine for reading the output data from a memory address writable by the first processor and for storing the read output data in an output data channel. In a further embodiment of the method of the invention, a subsequence can be understood in addition to be information, which unambiguously defines a series of processor commands executable by the second processor, whereby the processor commands defined by the subsequence in their entirety in each case form a routine for routing input data or output data. In the embodiment mentioned last, each subsequence is present first in the form of such information and before loading of the sequence in the second processor is translated into a sequence of processor commands executable by the second processor. For example, in an embodiment of the invention, each subsequence can be present first in the form of source code automatically written in a high-level language by a processor of the computer system, whereby before the sequence is loaded in the second processor each subsequence for the second processor is compiled.

Input data and output data can be routed in unchanged form by a sequence. A sequence can also include processor commands, however, in order to preprocess or process read-in data and to route the read-in data in preprocessed or processed form.

According to an embodiment of the invention, a sequence can be understood as a series of subsequences created by the merging of subsequences, regardless of whether the subsequences are present as a series of processor commands executable by the second processor or in the form of information defining a series of processor commands.

Input data can be understood to be data generated by a peripheral component of the computer system and provided for processing by the computer program executed by the main processor. Examples of input data are measured values of a sensor or an actual load integrated into an automotive simulation. An input data channel can be an interface unit data channel configured for storing input data by a peripheral component. Output data can be understood to be data generated by the computer program and provided for reading by a peripheral component. Examples of output data are control commands for an actuator of an actual load integrated into an automotive simulation. An output data channel can be an interface unit data channel configured for storing output data for reading by a peripheral component.

An advantage of the method of the invention is that the routine, executed by the second processor, for processing input data and output data is created in the first processor, which is also charged with the execution of the computer program. In an embodiment of the method, different subroutines of the computer program, which exchange data with the peripheral during the execution of the computer program data, in each case create a particular subsequence corresponding to the requirements of the particular subroutine. The sequence loaded in the second processor is thereby always adapted to the individual requirements of the computer program stored in the first processor. As a result, there is no need to maintain a large number of functionalities for preprocessing, processing, and routing data persistently to the second processor. During the execution of the computer program, the second processor executes the sequence successively, i.e., performs the processor commands in the sequence in the received order, and invests little computing capacity, in particular, no computing capacity, in the execution of unproductive, i.e., not immediately useful, processor commands such as jump instructions and function calls. Furthermore, there is no need for processor-side optimization measures to accelerate the execution of the program code stored in the second processor, for example, by caching, as a result of which a deterministic execution of the sequence by the second processor is assured.

A further advantage of the invention is cost reduction compared with solutions known from the prior art. Because the second processor may execute the sequence of processor commands only successively, a sufficiently rapid execution of the sequence is also assured when a technically simple, cost-effective processor is used in the interface unit.

Preferably the computer program includes at least one first I/O driver and a second I/O driver, whereby the first I/O driver creates the first subsequence and the second I/O driver creates the second subsequence. An I/O driver in the context of the invention can be understood to be a subroutine of a computer program task, whereby the I/O driver contains a subroutine for the exchange of data between the task and the peripheral.

In an exemplary embodiment, a configuration phase of the computer system is begun before the execution of the computer program is begun, whereby a software instance generates the sequence during the configuration phase, whereby the sequence is empty immediately after generation by the software instance, therefore still does not contain any processor commands and no information defining a processor command, and whereby the first I/O driver writes the first subsequence in the sequence and the second I/O driver writes the second subsequence in the sequence. In this embodiment, the software instance generates the sequence as an object, which is configured to receive a number of subsequences.

In an embodiment, the sequence is automatically optimized by a software instance before the sequence is loaded in the second processor. Optimization of the sequence can be understood in particular to be the purging of the sequence of redundant processor commands, for example, by removing redundant processor commands or by inserting a command for running a strobe. Because of the independent creation of the individual subsequences, redundant processor commands cannot be ruled out in the still not optimized sequence.

A strobe can be taken to mean that at least two processor commands for outputting a datum, i.e., at least one first processor command and a second processor command for writing a value in a memory address, are not carried out immediately after the particular processor command is called up by the second processor, but the first value to be written according to the first processor command and the second value to be written according to the second processor command are initially archived, and that in the execution of the strobe by the second processor the first value and the second value are written simultaneously or immediately one after the other. A strobe thus brings about a synchronization of the output of data in a sequence.

The subsequences can be created such that the sequence has a minimized number of jump instructions, in particular, no jump instructions. Further, the subsequences can be created such that the sequence contains no function calls.

Further, the second processor is or is made to be configured preferably not to use any caching during the execution of the sequence, so that the time needed for executing the sequence results unambiguously from the number of the processor commands in the sequence and from the clocking of the second processor.

In an embodiment of the method, the interface unit has at least two second processors operating in parallel, whereby an individual sequence is created for each second processor. A second processor in this embodiment can be understood to be any processor which is stored in the interface unit and which has the properties of the second processor and which is provided to execute a processor command sequence.

The interface unit can have an FPGA (field-programmable gate array), and the second processors stored in the interface unit are or are made to be implemented as soft-cores in the FPGA, in particular such that the soft-cores are or are made to be implemented as flow control processors.

In an embodiment of the method, the computer program includes more than one task, and each second processor is unambiguously assigned to a task, whereby the sequence loaded in a specific second processor contains only subsequences of I/O drivers of the task the specific processor is assigned to.

Furthermore, each task with at least one I/O driver can be assigned a priority, and the second processors are preferably assigned to the task with the highest priority.

In an embodiment, the execution of the sequence in a second processor is started by a trigger signal, whereby a second processor executes the sequence precisely once after a trigger signal is registered by the second processor. The trigger signal in this case is generated by an I/O driver or at predefined times by a timer.

A computer system is also provided with a first processor and an interface unit with a second processor which is stored in the interface unit and is configured to carry out a method for configuring the interface unit by means of the first processor. The computer system can be designed to execute a computer program by means of the first processor in hard real-time, in particular whereby the computer system is designed as a hardware-in-the-loop simulator or as a rapid control prototyping system.

A hardware-in-the-loop simulator in connection with the invention can be understood to be in particular a computer system, which is configured and provided to be connected to the data inputs and data outputs of an embedded system, for example, an electronic control unit or a mechatronic component, and which is configured furthermore, in particular, also with respect to the hardware installed in the computer system, to simulate the real environment of the embedded system in hard real-time.

A rapid control prototyping system in connection with the invention can be understood to be in particular a portable computer system, which is configured and provided to be integrated into a network of electronic control units, for example, in an automobile, to take over temporarily the task of an electronic control unit in the network and to exchange data with electronic control units in hard real-time, to read in data from sensors, and to control actuators.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
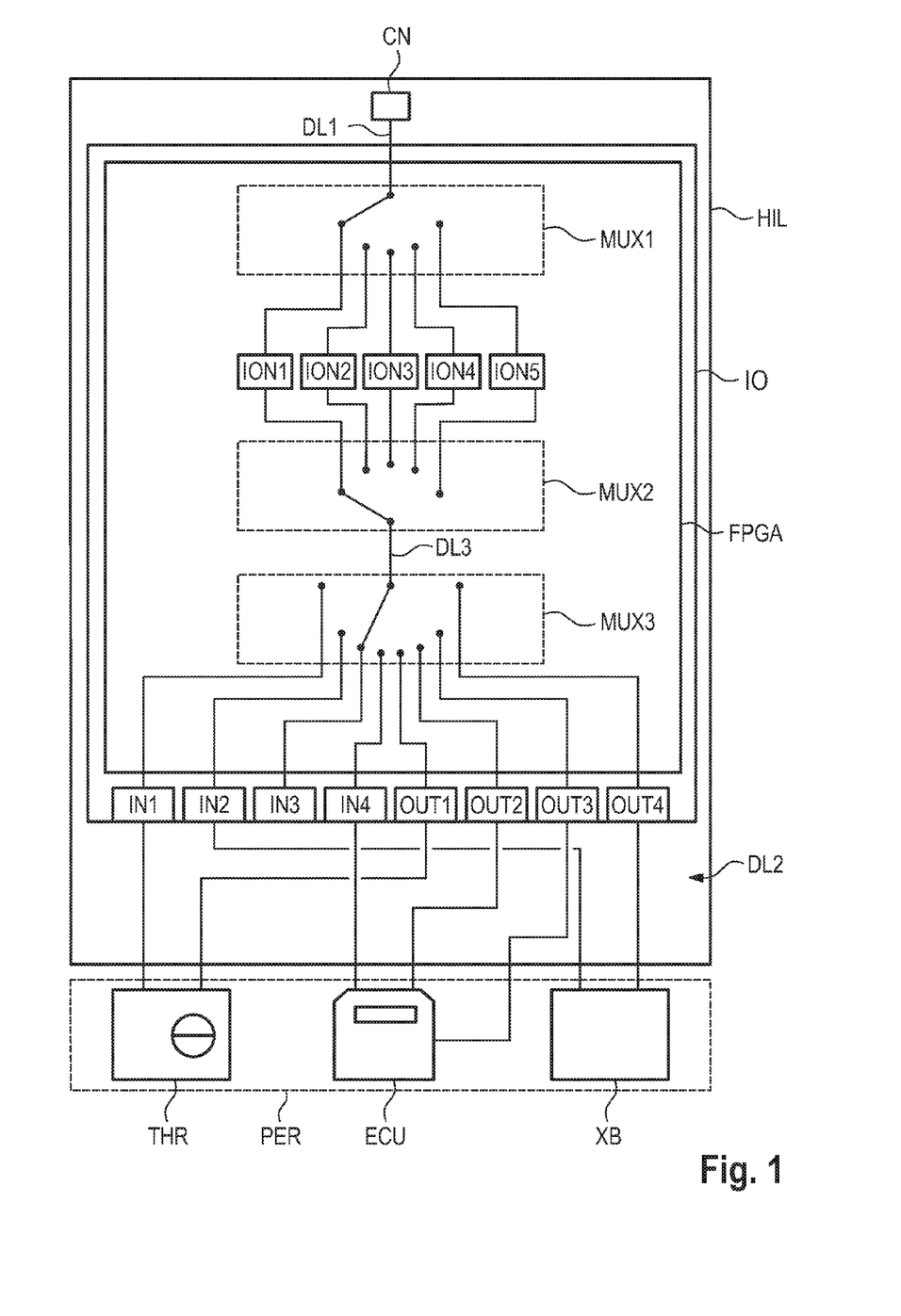
FIG. 1 shows a schematic view of a computer system designed to carry out the method of the invention.

The illustration in the figure shows a schematic diagram of a computer system HIL, designed as a hardware-in-the-loop simulator, abbreviated as HIL. Computer system HIL has a first processor CN and an interface unit IO formed as a plug-in I/O card, and a serial first data link DL1 is set up between first processor CN and interface unit IO. Computer system HIL is configured to execute a computer program for simulating an environment of an electronic control unit ECU, for example, an automotive control unit, for testing the software of the control unit ECU, in hard real-time by means of first processor CN.

An FPGA is installed in interface unit IO, and the interface unit has eight data channels, of which four are input data channels IN1, . . . , IN4 and four are output data channels OUT1, . . . , OUT4. Five interface processors ION1, . . . , ION5, which are programmed as so-called soft-cores in the FPGA logic circuit, are stored in the FPGA as second processors.

The term "interface processor" is used hereafter synonymously with the term "second processor" according to the claims. The term "interface processor" is used exclusively for the purpose of the better readability of the following explanations and, taken in isolation, contains no technical specifications, unless this is stated explicitly.

The implementation of a soft-core in a programmable logic circuit, for example, an FPGA, is familiar to the skilled artisan from the prior art. The five interface processors ION1, . . . , ION5 are implemented identically and designed as flow control processors (FCPs), i.e., their design and their command set are optimized for routing, preprocessing, and processing input data and output data. Each individual interface processor ION1, . . . , ION5 has only one computing core and is designed and provided to execute a sequence of processor commands successively. In particular, the interface processors ION1, . . . , ION5 do not have any devices for accelerating the execution of a command sequence, as many processors have, for example, caching or parallelization by a plurality of computing cores. Tests have shown that it is possible to implement eight FCPs, designed simply in this way, as soft-cores in an FPGA.

In a preferred embodiment, interface processors ION1, . . . , ION5 are not stored persistently in the FPGA, but are stored as a compilation in a flash memory of computer system HIL and are programmed in a configuration phase of computer system HIL before the execution of the computer program is started in the logic circuit of the FPGA, whereby interface processors ION1, . . . , ION5 are stored as unprogrammed processors; i.e., no processor commands are initially stored in interface processors ION1, . . . , ION5.

Interface unit IO is connected via a second data link DL2 to a peripheral environment PER. Peripheral environment PER contains three peripheral components: an actual load THR, an electronic control unit ECU, and an extension box XB. Second data link DL2 is set up as a plurality of cable connections, which are run between the peripheral components THR, ECU, XB of peripheral environment PER and data channels IN1, . . . , IN4, OUT1, . . . , OUT4 of interface unit IO. The actual load THR is, for example, a throttle valve of an automobile. Because the computer program is not capable of simulating a throttle valve, the throttle valve is integrated in the simulation as a physical component. First processor CN generates a control signal for an actuator of actual load THR according to the specifications of the computer program, and the control signal is transmitted via a data output OUT1 of interface unit IO to the actuator. A sensor of actual load THR is read via a data input IN1 of interface unit IO and the read sensor signal is evaluated by first processor CN based on the specifications of the computer program.

Electronic control unit ECU is a physical control unit, for example, an automotive control unit, which is integrated into the simulation, in order to test the software stored in electronic control unit ECU for correct functioning. To this end, first processor CN simulates in hard real-time the environment of the electronic control unit, in particular, other electronic control units, sensors, actuators, and driving maneuvers of the simulated vehicle, and to this end exchanges data with electronic control unit ECU. The electronic control unit is configured to read in output data from two output data channels OUT2, OUT3 of interface unit IO generated by first processor CN, and it is configured to store input data, generated by the electronic control unit ECU, in an input data channel IN4, for evaluation by first processor CN, for example, a control signal for a component simulated by first processor CN.

Extension box XB contains further computer components, assisting first processor CN in the execution of the computer program, in the form of plug-in printed circuit boards. Extension box XB is configured to read in output data from an output data channel OUT4 and to store input data in an input data channel IN2.

Interface processors ION1, ..., ION5 are connected via a first multiplexer MUX1, programmed in the FPGA logic circuit and controlled by a first arbiter (not shown), to first data link DL1, and the first arbiter is configured to assure access for first processor CN to precisely one interface processor ION1, ..., ION5 by means of the first multiplexer. Interface processors ION1, ..., ION5 are furthermore connected to data channels IN1, ..., IN4, OUT1, ..., OUT4 via a demultiplexer MUX2 and a second multiplexer MUX3, and a second arbiter (not shown) is configured to assure access for one of interface processors ION1, ..., ION5 to one of data channels IN1, ..., IN4, OUT1, ..., OUT4 by means of control of demultiplexer MUX2 and of second multiplexer MUX3.

A processor (not shown), which is configured to receive an input datum from a peripheral component THR, ECU, XB of peripheral environment PER and to make the input datum available to one of the interface processors ION1, ..., ION4 for reading, is stored in each of the four input data channels IN1, ..., IN4. A processor (not shown), which is configured to receive an output datum from one of the interface processors ION1, ..., ION5 and to make it available to a peripheral component of peripheral environment PER for reading, is stored in each of the four output data channels OUT1, ..., OUT4.

Figure 2:
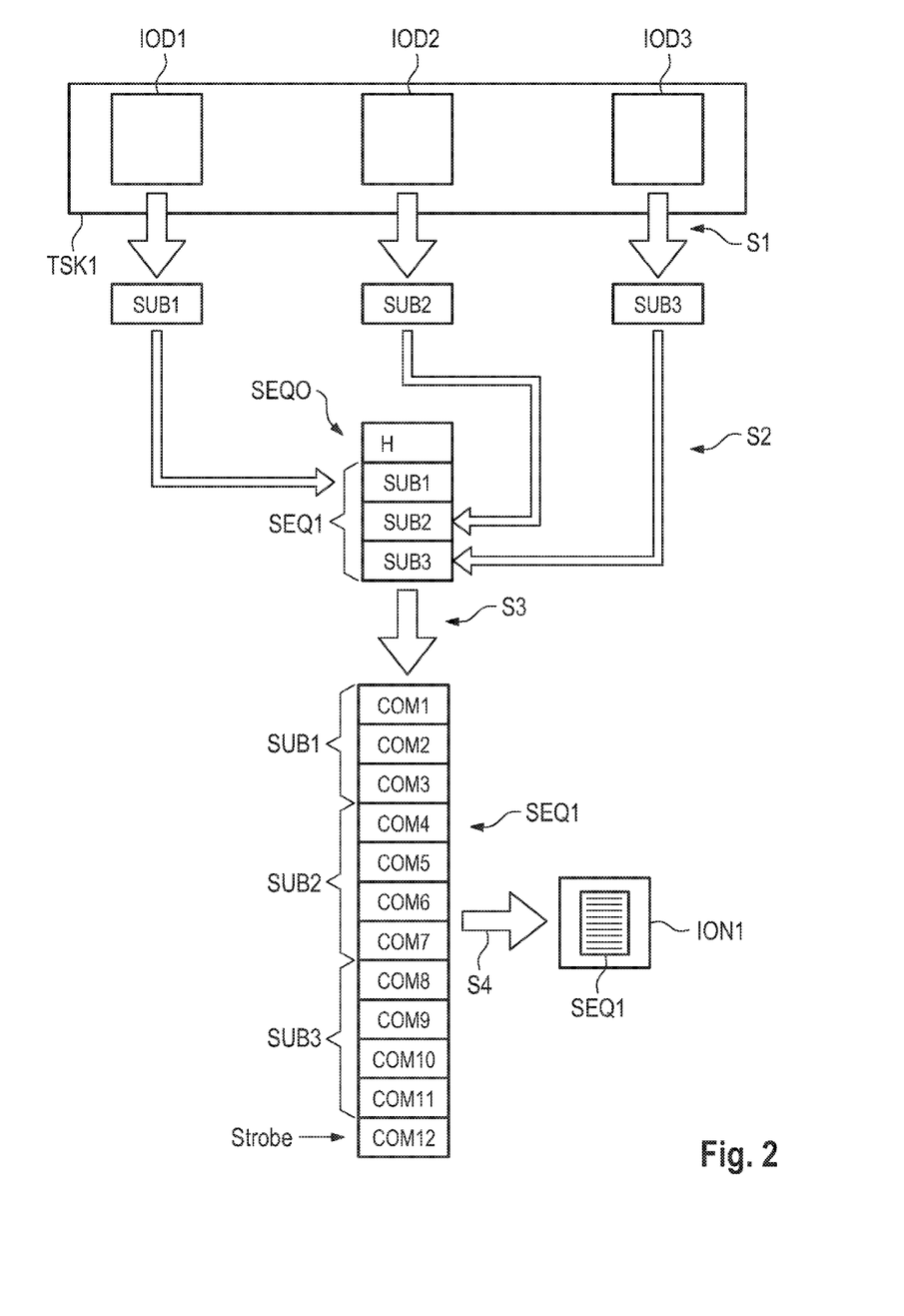
FIG. 2 shows a representation of process steps for creating a sequence of processor commands.

The illustration in FIG. 2 shows process steps for creating a sequence of processor commands for an interface processor ION1 in a preferred embodiment of the method of the invention. A first task TSK1 of the computer program stored in first processor CN includes a first I/O driver IOD1, a second I/O driver IOD2, and a third I/O driver IOD3. In a first process step S1, each I/O driver IOD1, IOD2, IOD3 of first task TSK1 creates a subsequence for execution by interface processor ION1. First I/O driver IOD1 creates a first subsequence SUB1, second I/O driver IOD2 creates a second subsequence SUB2, and third I/O driver IOD3 creates a third subsequence SUB3.

First subsequence SUB1, second subsequence SUB2, and third subsequence SUB3 each represent a routine for routing input data, stored in an input data channel, for storing at a memory address, readable by first processor CN, or for routing output data, generated by first processor CN, for storing in an output data channel. Subsequence SUB1, SUB2, SUB3 contain no function calls.

First subsequence SUB1, second subsequence SUB2, and third subsequence SUB3 are present after the running of the first process step in the form of a sequence of program commands formulated in a high-level language, for example, a sequence of C++ commands. Each subsequence SUB1, SUB2, SUB3 contains at least one program command for routing an input datum or an output datum, for example, a command from the family of memcpy commands, as defined in the C++ language. An example is the command memcpy32, whose syntax in simplest form is as follows:

memcpy32(add2, add1, n);

The command, beginning at memory address add1, reads in a number of n data of 32-bit word length and writes the data at memory address add2. If the command is meant for routing an input datum, then add1 is a memory address in an input data channel, therefore a memory address, which is writable and readable by the processor stored in an input data channel, and add2 is a memory address readable by first processor CN. If the command is meant for routing an output datum, then add1 is a memory address writable by first processor CN, and add2 is a memory address in an output data channel, therefore a memory address, which is writable and readably by the processor stored in an output data channel. Each I/O driver IOD1, ..., IOD3 creates the memcpy32 commands with relative memory addresses as values for add1 and add2 in relation to a memory address defined as zero within the particular I/O driver IOD1, ..., IOD3.

Each subsequence SUB1, SUB2, SUB3 is automatically created based on the requirements of task TSK1, in which the particular I/O driver is integrated, and based on user-defined configuration data and is adapted in each case to the individual requirements of task TSK1. In an exemplary application, first I/O driver IOD1 is provided to read out a control signal for a pulse width modulation of an actuator signal at an input data channel IN1, and a user can specify by means of a configuration software whether only the duty cycle of the actuator signal is to be modulated or whether the duty cycle and the frequency of the actuator signal are to be modulated. In the first case, first I/O driver IOD1 writes only one memcpy32 command for routing a target value for the duty cycle in first subsequence SUB1. In the second case, first I/O driver IOD1 writes two memcpy32 commands in first subsequence SUB1, one for routing a target value for the duty cycle and one for routing a target value for the frequency. First I/O driver IOD1 can create a subsequence SUB1 such that it contains exclusively one or more memcpy32 commands. Apart from a number of memcpy32 commands, first I/O driver IOD1 can optionally write other program commands for preprocessing or processing the input data in first subsequence SUB1.

Similarly, each subsequence SUB1, ..., SUB3 includes at least a number of memcpy32 commands, but optionally can have other program commands for preprocessing or processing input data or output data, for example, program commands to scale input data or output data or to provide them with a constant component.

In a second process step S2, subsequences SUB1, SUB2, SUB3 are merged to form a sequence SEQ1. To this end, a software instance first creates a software object SEQO. Software object SEQO contains a header field H with information on first I/O driver IOD1, second I/O driver IOD2, and third I/O driver IOD3, and software object SEQO is configured to receive and store a number of subsequences SUB1, ..., SUB3 formulated in a high-level language. The I/O drivers of first task TSK1 then write one after another their respective subsequences SUB1, ..., SUB3 in software object SEQO; i.e., first I/O driver IOD1 first writes first subsequence SUB1 in software object SEQO, then second I/O driver IOD2 writes second subsequence SUB2 in software object SEQO behind first subsequence SUB1, and then third I/O driver IOD3 writes third subsequence SUB3 in software object SEQO behind second subsequence SUB2. Software object SEQO now includes header field H and a first sequence SEQ1, assembled from first subsequence SUB1, second subsequence SUB2, and third subsequence SUB3.

In a third process step S3, sequence SEQ1 is preprocessed to be loaded in an interface processor ION1. In a first optimization, the relative memory addresses in memcpy32 commands are replaced by absolute memory addresses, whereby the information necessary for this is obtained from header field H, and first sequence SEQ1 is supplemented by a command for executing a strobe. After the first optimization has been completed, first sequence SEQ1 is translated into a sequence of processor commands readable and executable by an interface processor ION1. In a second optimization, redundant processor commands are removed from first sequence SEQ1.

After third process step S3 is completed, first sequence SEQ1 is present as a sequence of twelve processor commands COM1, . . . , COM12, whereby first subsequence SUB1, second subsequence SUB2, and third subsequence SUB3 are each contained as a continuous sequence of processor commands. Three successive processor commands COM1, . . . , COM3 depict the functionality of first subsequence SUB1, four successive processor commands COM4, . . . , COM7 the functionality of second subsequence SUB2, and four other successive processor commands COM8, . . . , COM11 the functionality of third subsequence SUB3. A strobe command COM12 closing first sequence SEQ1 brings about the synchronous output of the data of first subsequence SUB1, second subsequence SUB2, and third subsequence SUB3. The successive execution of first sequence SEQ1 by a second processor ION1 therefore corresponds to a successive running of first subsequence SUB1, second subsequence SUB2, and third subsequence SUB3. First sequence SEQ1 does not include any function calls and jump instructions.

In a fourth process step S4, the optimized sequence SEQ1 is loaded in an interface processor ION1 assigned to task TSK1.

Figure 3:
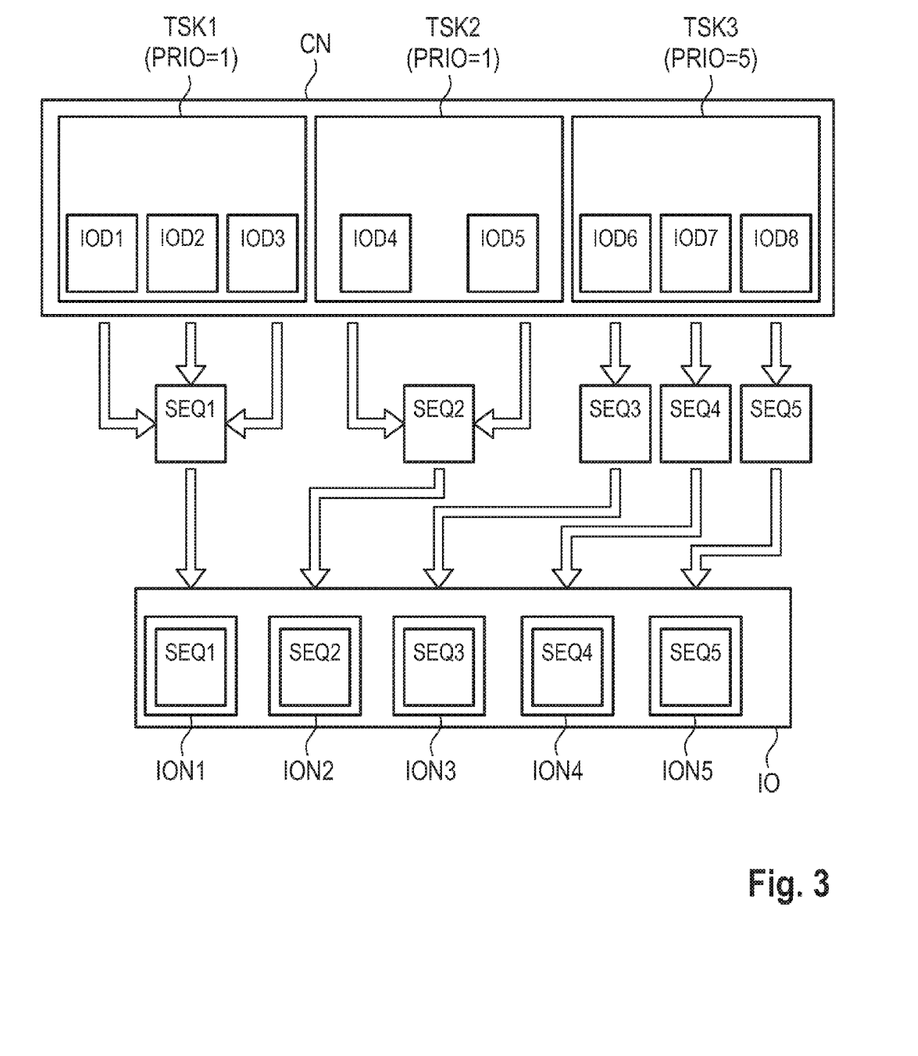
FIG. 3 shows a representation of the creation of multiple sequences by the first processor and their distribution to several second processors.

The illustration in FIG. 3 shows the creation according to the invention of a plurality of sequences SEQ1, . . . , SEQ5 and the distribution of sequences SEQ1, . . . , SEQ5 to a plurality of interface processors ION1, . . . , ION5. The creation of each sequence SEQ1, . . . , SEQ5 occurs in the same way as the creation of first sequence SEQ1, as described in the description of FIG. 2. In the illustrated exemplary embodiment, the computer program, stored in first processor CN, includes a first task TSK1 with a first I/O driver IOD1, a second I/O driver IOD2, and a third I/O driver IOD3, a second task TSK2 with a fourth I/O driver IOD4 and a fifth I/O driver IOD5, and a third task TSK3 with a sixth I/O driver IOD6, a seventh I/O driver IOD7, and an eighth I/O driver IOD8. First task TSK1, second task TSK2, and third task TSK3 are each assigned a priority defined by a parameter PRIO, whereby the value of PRIO is a natural number and the value PRIO=1 indicates a task with the lowest possible priority. A software instance during the configuration phase assigns at least one interface processor ION1, . . . , ION5 to each task TSK1, TSK2, TSK3, which has at least one I/O driver IOD1, . . . , IOD8. The number of the interface processors ION1, . . . , ION5 stored in interface unit IO is accordingly an upper limit for the number of tasks TSK1, . . . , TSK3 in first processor CN, which tasks can be configured to exchange data with the peripheral environment PER, therefore to store output data in an output data channel OUT1, . . . , OUT4 or to read in input data from an input data channel IN1, . . . , IN4. The software instance is configured to prefer highly prioritized tasks in the assignment of interface processors ION1, . . . , ION5, therefore to assign preferably still unassigned interface processors ION1, . . . , ION5 to a task with a high priority. After the configuration phase has been completed, each interface processor ION1, . . . , ION5 is unambiguously assigned to a task TSK1, . . . , TSK3.

First task TSK1 and second task TSK2 are each assigned the lowest priority (PRIO=1), and for this reason, only one interface processor ION1, . . . , ION5 is assigned to both of them. A first interface processor ION1 is assigned to first task TSK1. The I/O drivers of first task TSK1, therefore first I/O driver IOD1, second I/O driver IOD2, and third I/O driver IOD3, together create a first sequence SEQ1; i.e., first sequence SEQ1 contains the subsequences created by first I/O driver IOD1, second I/O driver IOD2, and third I/O driver IOD3. A second interface processor ION2 is assigned to second task TSK2. The I/O driver of second task TSK2, therefore fourth I/O driver IOD4 and fifth I/O driver IOD5, together create a second sequence SEQ2; i.e., second sequence SEQ2 contains the subsequences created by fourth I/O driver IOD4 and fifth I/O driver IOD5.

Third task TSK3 is more highly prioritized than first task TSK1 and second task TSK2, for example, because the rapid processing of the input data read in by third task TSK3 is particularly important or because third task TSK3 processes large amounts of input data and for this reason requires many computing resources in order to process the input data read in by third task TSK3 in hard real-time. The priority assigned to the third task is PRIO=5. Third task TSK3 for this reason is assigned three interface processors ION3, ION4, ION5, so that the I/O drivers of third task TSK3, therefore sixth I/O driver IOD6, seventh I/O driver IOD7, and eighth I/O driver IOD8, each have available their own interface processor ION1, . . . , ION5 for storing a sequence SEQ3, . . . , SEQ5, and an individual sequence SEQ3, . . . , SEQ5 is created for each I/O driver of third task TSK3. Sixth I/O driver IOD6 creates a subsequence and writes the subsequence in a third sequence SEQ3. Seventh I/O driver creates a subsequence and writes the subsequence in a fourth sequence SEQ4. The eighth I/O driver creates a subsequence and writes the subsequence in a fifth sequence SEQ5. Third sequence SEQ3, fourth sequence SEQ4, and fifth sequence SEQ5 each contain only a single subsequence.

The created sequences SEQ1, . . . , SEQ5, as described in the description of FIG. 2, are translated and optimized into a processor command sequence readable and executable for an interface processor ION1, . . . , ION5, and the converted and optimized sequences SEQ1, . . . , SEQ5 are loaded into interface processors ION1, . . . , ION5. First interface processor ION1 is assigned to first task TSK1; for this reason, first sequence SEQ1 is loaded into first interface processor ION1. Second interface processor ION2 is assigned to second task TSK2; for this reason, second sequence SEQ2 is loaded into second interface processor ION2. Third interface processor ION3, fourth interface processor ION4, and fifth interface processor ION5 are each assigned to third task TSK3. Third sequence SEQ3 is loaded in third interface processor ION3, fourth sequence SEQ4 in fourth interface processor ION4, and fifth sequence SEQ5 in fifth interface processor ION5.

After the configuration phase is completed, the execution of the computer program by first processor CN and the execution of sequences SEQ1, . . . , SEQ5 by interface processors ION1, . . . , ION5 are started. Sequences SEQ1, . . . , SEQ5 contain processor commands in order to read input data from an input data channel IN1, . . . , IN4, to process them, and to write a result of the processing of the input data at a memory address readable by first processor CN, and a task TSK1, . . . , TSK3 reads the value stored at memory address and assigns a value to a variable of the computer program based on the value stored at the memory address. Sequence SEQ1, . . . , SEQ5 contain furthermore processor commands to read values from a memory address writable by first processor CN, to process the read value, and to store the results of the processing as output data in an output data channel OUT1, . . . , OUT4. Each sequence SEQ1, . . . , SEQ5 is adapted individually to the requirements of the particular task TSK1, . . . , TSK3, and each interface processor ION1, . . . , ION5 successively processes the sequence SEQ1, . . . , SEQ5 stored in it. The parallel execution of sequences SEQ1, . . . , SEQ5 in a plurality of interface processors ION1, . . . , ION5 rules out, moreover, that the execution of a sequence SEQ1, . . . , SEQ5 is interrupted in favor of the execution of a different sequence SEQ1, . . . , SEQ5 of a more highly prioritized task TSK1, . . . , TSK3. A rapid, i.e., time-optimized, and low-jitter execution of sequences SEQ1, . . . , SEQ5 is assured in this way.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for configuring an interface unit of a computer system, the method comprising:
   providing the computer system with a first processor and a first data link between the first processor and the interface unit and a second processor is or is made to be stored in the interface unit;
   providing the interface unit with at least two data channels, wherein a first input data channel is designed as a data channel for storing input data and a first output data channel is designed as a data channel for storing output data;
   configuring a peripheral environment of the computer system such that the peripheral environment comprises at least two peripheral devices and the peripheral environment is configured to store input data in the first input data channel or to read output data from the first output data channel via a second data link;
   configuring the interface unit to provide a data link for reading the input data stored in the first input data channel by the second processor and to provide a data link for storing output data in the first output data channel by the second processor;
   storing a computer program in the computer system;
   programming the first processor to execute the computer program and during the execution of the computer program, assigning a value, which is defined by the input data stored in the first input data channel to a variable of the computer program;
   creating a sequence of processor commands and loading the sequence in the second processor;
   starting, after the loading of the sequence in the second processor, the execution of the computer program by the first processor and the execution of the sequence by the second processor;
   writing, during the execution of the sequence, a value defined by the data stored in the first input data channel, at a first memory address; and
   creating a plurality of subsequences of processor commands,
   wherein a first subsequence represents a routine for reading in and processing at least the data stored in the first input data channel,
   wherein a second subsequence represents a routine for reading in and processing at least the data stored in a second input data channel or represents a routine for processing data generated by the first processor and for storing the processed data in the first output data channel, and
   wherein the sequence is created by merging the subsequences into a series of subsequences.

2. The method according to claim 1, wherein the computer program includes at least one first I/O driver and a second I/O driver, wherein the first I/O driver creates the first subsequence and the second I/O driver creates the second subsequence.

3. The method according to claim 2, wherein a configuration phase is started before the execution of the computer program is begun, wherein a software instance generates the sequence during the configuration phase, wherein the sequence is empty immediately after generation by the software instance, and wherein the first I/O driver writes the first subsequence in the sequence and the second I/O driver writes the second subsequence in the sequence.

4. The method according to claim 1, wherein the sequence is optimized before the sequence is loaded in the second processor, and wherein redundant commands are removed from the sequence or redundant memory accesses are removed from the sequence or a processor command to run a strobe is added to the sequence.

5. The method according to claim 1, wherein the sequence includes a minimized number of jump instructions or no jump instructions, or wherein the sequence includes no function calls.

6. The method according to claim 1, wherein the second processor is or is made to be configured not to use any caching during the execution of the sequence.

7. The method according to claim 1, wherein the interface unit has at least two second processors and an individual sequence is created for each second processor.

8. The method according to claim 7, wherein the interface unit has an FPGA and the second processors are or are made to be implemented as soft-cores in the FPGA, and wherein the soft-cores are or are made to be implemented as flow control processors.

9. The method according to claim 7, wherein the computer program includes more than one task and each second processor is unambiguously assigned to a task, wherein the sequence loaded in a specific second processor contains only subsequences of I/O drivers of the task the specific processor is assigned to.

10. The method according to claim 9, wherein each task with at least one I/O driver is assigned a priority and the second processors are assigned to the task with the highest priority.

11. The method according to claim 1, wherein the execution of the sequence in a second processor is started by a trigger signal, and wherein the trigger signal is generated by an I/O driver or by a timer.

12. A computer system comprising:
    a first processor; and
    an interface unit,
    wherein the interface unit has at least two data channels, a first input data channel being configured as a data channel for storing input data in the input data channel by a peripheral environment and a first output data channel being configured for storing output data for a peripheral environment, wherein the interface unit has a second processor, and the interface unit is configured to provide a data link for reading the input data stored in the first input data channel by the second processor and to provide a data link for storing output data in the first output data channel by the second processor, wherein the computer system has a first data link between the first processor and the second processor, wherein the computer system is configured to start a configuration phase before the start of the execution of a computer program by the first processor during the configuration phase to create a sequence of processor commands and to load the sequence in the second processor, wherein at least one first I/O driver and a second I/O driver are stored in the first processor, wherein the computer system is configured to create a plurality of subsequences during the configuration phase, wherein the first I/O driver is configured to create a first subsequence of processor commands during the configuration phase, wherein the first subsequence represents a routine for reading in and processing at least the data stored in a first input data channel, wherein the second I/O driver is configured to create a second subsequence of processor commands during the configuration phase, wherein the second subsequence represents a routine for reading in and processing at least the data stored in a second input data channel or represents a routine for processing data generated by the first processor and for storing the processed data in the first data output channel, and wherein the computer system is configured to create the sequence by merging the first subsequence and the second subsequence into a series of subsequences.

13. The computer system according to claim 12, wherein the computer system executes the computer program via the first processor in hard real-time, and wherein the computer system is a hardware-in-the-loop simulator or as a rapid control prototyping system.

14. The computer system according to claim 12, wherein the computer system creates the sequence with a minimized number of jump instructions or with no jump instructions.

15. The computer system according to claim 12, wherein the second processor is configured not to use any caching during the execution of the sequence.

16. The computer system according to claim 12, wherein the interface unit has at least two second processors, and wherein the computer system creates an individual sequence for each second processor and loads an individual sequence in each second processor.

* * * * *